United States Patent [19]

Ooka

[11] Patent Number: 5,030,891
[45] Date of Patent: Jul. 9, 1991

[54] PHOTOELECTRIC SWITCH

[75] Inventor: Taneji Ooka, Ootsu, Japan

[73] Assignee: Omron Tateisi Electronic Co., Kyoto, Japan

[21] Appl. No.: 441,651

[22] Filed: Nov. 27, 1989

[30] Foreign Application Priority Data

Nov. 30, 1988 [JP] Japan ................. 63-305026

[51] Int. Cl.$^5$ ............................. H05B 37/02
[52] U.S. Cl. ................... 315/226; 250/214 SW
[58] Field of Search ............. 315/226, 159, 219; 307/247.1; 354/41 S; 250/551, 214 SW, 214 R, 214 B; 455/618

[56] References Cited

U.S. PATENT DOCUMENTS

| | | | |
|---|---|---|---|
| 3,886,486 | 5/1975 | Maddox | 331/111 |
| 3,967,111 | 6/1976 | Brown | 250/214 R |
| 4,051,411 | 9/1977 | Knoble | 315/226 |
| 4,075,474 | 2/1978 | Straus et al. | 250/205 X |
| 4,114,071 | 9/1978 | Thrower | 315/226 |
| 4,295,717 | 10/1981 | Kitagawa | 354/41 S |
| 4,441,053 | 4/1984 | Daspit | 315/226 |
| 4,675,519 | 6/1987 | Price | 250/214 R |
| 4,916,362 | 4/1990 | Orenstein | 315/226 |
| 4,940,889 | 7/1990 | Ono | 250/214 R |

Primary Examiner—Eugene R. Laroche
Assistant Examiner—Amir Zarabian
Attorney, Agent, or Firm—Dickstein, Shapiro & Morin

[57] ABSTRACT

A photoelectric switch having a light projector element (L) and a first oscillation circuit (2) for driving the light projector element by use of pulses includes a second oscillation circuit (4) and a coupling circuit (3) for coupling the second oscillation circuit with the first oscillation circuit. The second oscillation circuit sweeps an oscillation frequency of the first oscillation circuit at a predetermined period to vary the oscillation frequency of the first oscillation circuit in a periodical manner.

6 Claims, 2 Drawing Sheets

PHOTOELECTRIC SWITCH

BACKGROUND OF THE INVENTION

1. Field of the Invention

The present invention relates to a photoelectric switch, and in particular, to a photoelectric switch suitable when a plurality of photoelectric switches are to be arranged in parallel.

2. Description of the Prior Art

In general, in a photoelectric switch, a light-emitting element is intermittently driven by an output from an oscillation circuit to produce a pulsated light or optical signal, which is then received by a light receiving element, thereby achieving a switching operation. In a case where a plurality of photelectric switches of this kind are arranged in parallel, if the oscilaltion frequencies thereof are identical or similar to each other, there may occur a mutual interference therebetween and hence a wrong operation takes place in some cases. In order to overcome this difficulty, according to the prior art technology, when a light is received as an input before a photoelectric switch projects a light, the light signal is generated at a timing slightly delayed thereafter.

In accordance with a technology to prevent the mutual interference of the conventional photoelectric switches, in a case where a light is received as an input before a photoelectric switch emits a light, only the light emission timing is slightly shifted or delayed. In consequence, the frequencies are not changed, namely, are similar to each other. This means that the method above is not the fundamental countermeasure to completely prevent the interference. Particularly, the conventinal method is less efficient when three or more switches are disposed in parallel.

SUMMARY OF THE INVENTION

It is therefore an object the present invention to provide a photoelectric switch capacble of reducing a chance of the wrong operation due to a mutual interference even when a plurality of such switches are arranged in parallel.

In accordance with the present invention, there is provided a photoelectric switch having a light projector element and a first oscillation circuit for driving the light projector element with pulse signals. The switch includes a secoood oscillation circuit and couple means for coupling said second oscillation circuit with said first oscillation circuit. The second oscillation cirucit sweeps at a predetermined period the oscillation frequency of the first oscillation circuit to change the frequency of the first oscillation circuit.

In this photoelectric switch, the oscillation frequency of the first oscillation circuit, which is linked with the second oscillation circuit, is swept in a fixed range of frequency. Namely, the oscillation frequency of the first oscillation circuit periodically varies. In a case where a plurality of these switches are arranged in parallel, the oscillation circuits thereof operate in an asynchronous manner. Consequently, there is minimized a chance in which oscillation frequencies become to be identical to each other and hence the occurrence of the mutual interference is reduced. In consequence, the wrong operation due to the mutual·interference is avoided.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENT

Figure 1:
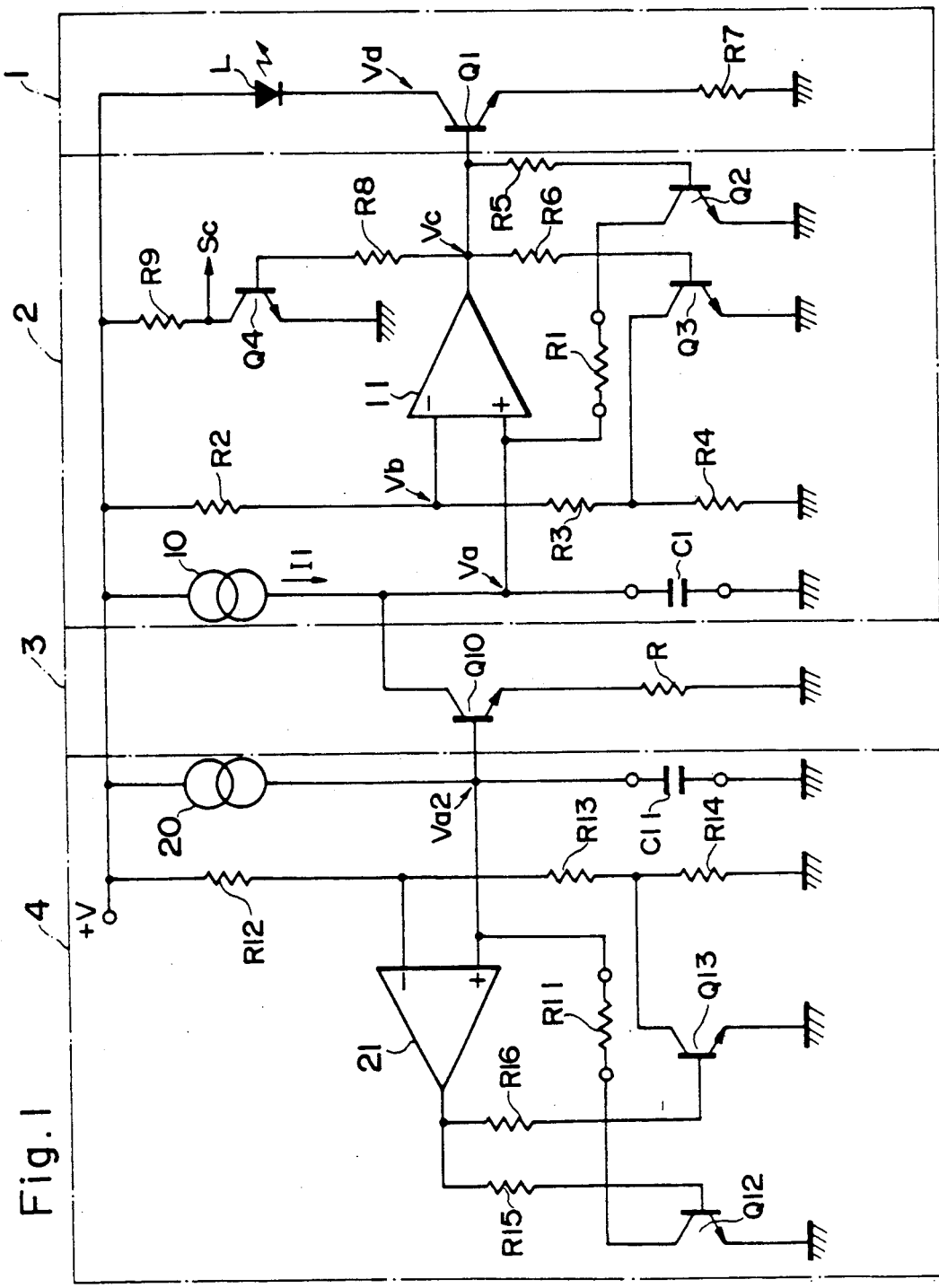
FIG. 1 is a schematic diagram showing a circuit of a light projector unit of a photoelectric switch as an embodiment in accordance with the present invention.

Referring now to the drawings, description will be given in detail of an embodiment of the photoelectric switch in accordance with the present invention.

FIG. 1 is a circuit diagram of a light projector unit of a photoelectric switch as an embodiment in accordance with the present invention. The light projector unit of this switch includes a light projector circuit 1, a first oscillation circuit 2, a modulation circuit 3, and a second oscillation circuit 4.

The light projector circuit 1 includes a light emitting element L and a transistor Q1 to drive the light emitting element L.

In addition, the first oscillation circuit 2 comprises a constant current source 10, a capacitor C1 to be charged by use of a current from the constant current source 10, resistors R2, R3 and R4 connected in series for producing reference voltage Vb, comparator 11 for comparing a reference voltage Vb appearing at a connecting point between the resistors R2 and R3 with a charge voltage Va of the capacitor C1, a transistor Q3 for providing a hysteresis characteristic to the comparator 11, a resistor R1 and a transistor Q2 for discharging the electric charge from the capacitor C1. Also included in the configuration is a transistor Q4, which turns on when an output Vc from the comparator 11 is set to a high level so as to supply a light receiving unit with a synchronization signal Sc.

The second oscillation circuit 4 is basically the same in the configuration as the first oscillation circuit 2. This circuit 4 includes a comparator 21, a constant current source 20, a charge capacitor C11, resistors R12, R13 and R14 for producing reference voltage, a transistor Q13 for providing a hysteresis characteristic to the comparator 21, a resistor R11 and a transistor Q12 for discharging the electric charge from the capacitor C11.

Moreover, the modulation or modulator circuit 3 comprises an emitter-follower transistor Q10 and a resistor R to draw a portion of the current flowing from the constant current source 10.

Figure 2:
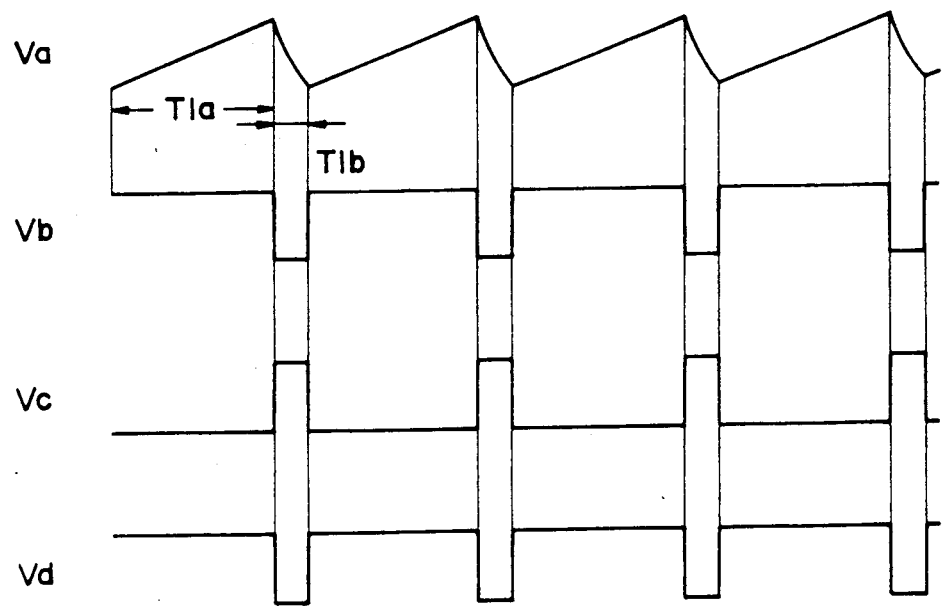
FIG. 2 is a graph of waveforms useful to explain operations of the first oscillation circuit of the light projector unit of the photoelectric switch.

Referring next to graphs of FIG. 2, a description will be given of operations of the first oscillation circuit 2 in a state where neither the modulation circuit 3 nor the second oscillation circuit 4 is connected to the first oscillation circuit 2 in the projector unit of the photoelectric switch of this embodiment.

First, when the system is powered, the constant current source 10 supplies a charge current I1 to the capacitor C1 so as to increase the charge voltage Va of the capacitor C1. At a point where the voltage Va exceeds the divided voltage Vb at the connecting point of the resistors R2 and R3 (i.e. when a charge period of time T1a is elapsed), the output Vc from the comparator 11 changes from a low level to a high level. In response to this signal at the high level, the transistor Q1 of the light projector circuit 1 turns on to flow a current into the light emitting element L, which resultantly produces a light signal. A voltage Vd on the collector side of the transistor Q1 is decreased from a high level to a low level. Furthermore, in response to the output from the comparator 11, the transistors Q2, Q3, and Q4 respectively turn on. As a result, a light receiving unit, not shown, is supplied with the synchronization signal Sc because the transistor Q4 turns on. On the other hand, since the transistor Q2 turns on, the electric charge accumulated in the capacitor C1 is discharged via the resistor R1 and the transistor Q2. Since a discharge time constant determined by the capacitance of the capacitor C1 and the resistance value of the resistor R1 is smaller than a charge time constant effective when the capacitor C1 is charged, the discharge operation is instantaneously completed. In consequence, the light emitting element L turns on during a discharge period of time T1b which is shorter than the charge period of time T1a. Moreover, Since the transistor Q3 turns on, the connecting point between the resistors R3 and R4 is connected to a ground potential, the reference voltage Vb of the comparator 11 becomes to be a voltage divided by means of the resistors R2 and R3. That is, once the output voltage from the comparator 11 is set to a high level, the reference voltage Vb becomes smaller. With this provision, the comparator 11 is provided with a hysteresis characteristic so as to establish a state for a stable oscillation. When the voltage Va of the capacitor C1 becomes to be lower than the reference voltage Vb, the output from the comparator 11 is again set to a low level. Consequently, the transistors Q1, Q2, Q3, and Q4 respectively turn off and hence the constant current source 10 starts charging the capacitor C1.

By repeatedly achieving the operation above, the light emitting element L repetitiously outputs a light signal with a pulse width T1b in an intermittent fashion at a period of T1a+T1b. Namely, when only the first oscillation circuit 2 is employed, the light signal is produced with a fixed frequency f1=1/(T1a+T1b).

However, since the photoelectric switch of this embodiment includes the modulation circuit 3 and the second oscillation circuit 4, the oscillation frequency f1 of the first oscillation circuit 2 is swept depending on the operation of the second oscillation circuit 4.

Referring now to graphs of FIG. 3, a description will be given of the operation in which the oscillation frequency f1 of the first oscillation circuit 2 is swept by means of the second oscillation circuit 4 and the modulation circuit 3.

The second oscillation circuit 4 achieves basically the same operation as the first oscillation circuit 2. The oscillation frequency f2 of the second oscillation circuit 4 is set to a value quite smaller than the oscillation frequency f1 of the first oscillation circuit 2. For example, these values are set as f1=50 kHz. and f2=1 kHz. The oscillation frequency of the second oscillation circuit 4 is represented by f2=1/(T2a+T2b); where, T2a is a charge time onto the capacitor C11 and T2b is a discharge time of the discharge circuit including the resistor R11 and the transistor Q12. The periods of time are set as T2a+T2b.

Figure 3:
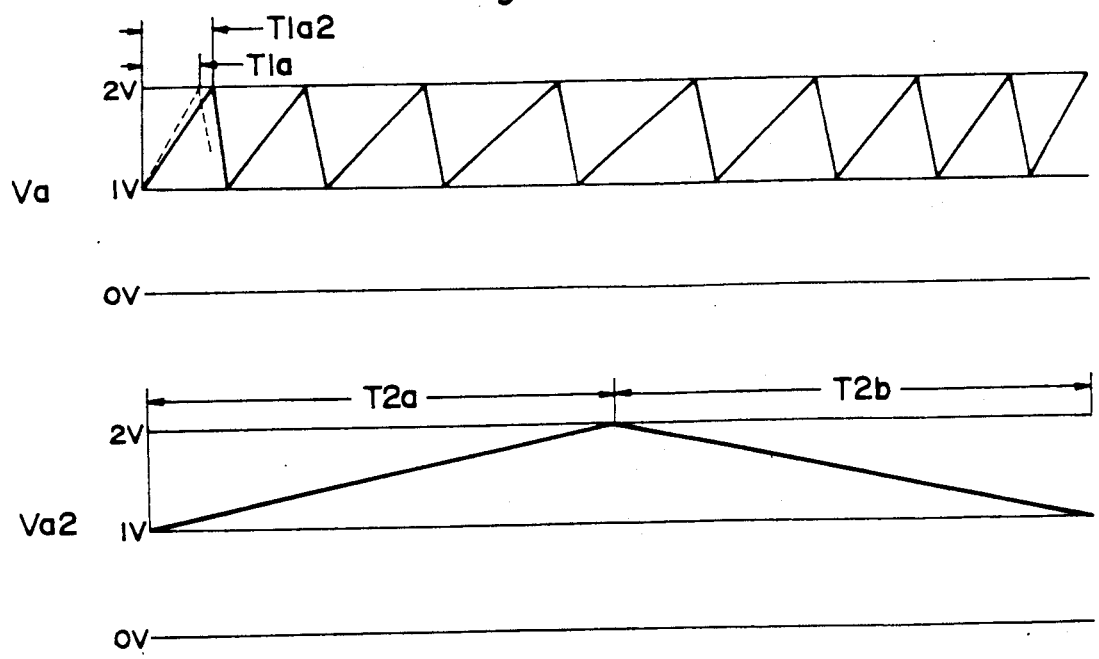
FIG. 3 is a graph of waveforms for explaining the overall operation of the light projector unit of the photoelectric switch in this embodiment.

As shown in FIG. 3, it is assumed that the first oscillation circuit 2 oscillates with a voltage ranging from 1 V to 2 V. Namely, the reference voltage Vb of the comparator 11 is set to 1 V or 2 V when the output voltage Vc from the comparator 11 is at a high or low level, respectively. Naturally, these reference voltages may be arbitrarily set. It is also assumed that the second oscillation circuit 4 oscillates with a voltage in a range from 1 V to 2 V.

The transistor Q10 of the modulation circuit 3 is controlled by the charge voltage Va2 of the capacitor C11 in the second oscillation circuit 4. Depending on the voltage Va2 applied to a base of the transistor Q10, the output current I1 from the current source 10 of the first oscillation circuit 2 is passed to the transistor Q10. The transistor Q10 has an emitter potential which is lower than the base voltage Va2 by a voltage $V_{BE}$ developed between the base and the emitter thereof. The current flowing through the transistor Q10 into the resistor R is represented by $(Va2-V_{BE})/R$. In consequence, the current supplied to the capacitor C1 of the first oscillation circuit 2 is expressed as $I1-(Va2-V_{BE})/R$. As a result, in the first oscillation circuit 2, a period of time (charge time) T1a2 required to charge the capacitor C1 from 1 V to 2 V becomes to be longer than the charge time T1a described above.

As the charge voltage Va2 of the capacitor C11 of the second oscillation circuit 4 is increased, the current branching through the transistor Q10 into the resistor R becomes greater. Consequently, the charge time of the capacitor C1 of the first oscillation circuit 2 is further elongated. In this fashion, in the charge period of the capacitor C11 of the second oscillation circuit 4, the oscillation frequency of the first oscillation circuit 2 is gradually reduced.

When the voltage Va2 of the capacitor C11 in the second oscillation circuit 4 reaches the higher reference voltage (2 V) of the comparator 21, the transistor Q12 turns on and then the electric charge of the capacitor C11 is discharged through the resistor R11. Since the voltage Va2 of the capacitor C11 is gradually reduced, the oscillation frequency of the first oscillation circuit 2 is accordingly increased. When the voltage Va2 of the capacitor C11 reaches the lower reference voltage (1 V) of the comparator 21, the capacitor C11 is again charged and hence the oscillation frequency is gradually lowered.

In this fashion, the first oscillation frequency repeatedly develops an increase and a decrease at a period of 1/f2. Since the first oscillation circuit 2 produces the synchronization signal Sc in synchronism with the oscillation as described above, the light receiving unit also operates in a synchronous fashion with respect to the oscillation.

The present invention is applicable to a transmissive photoelectric switch in which a light projector unit and a light receiving unit are arranged to oppose each other with a distance therebetween and to a reflective photoelectric switch in which a light projector unit and a light receiving unit are housed in a case or are arranged to be adjacent to each other.

Particularly, in a case where the circuit of the light projector unit is implemeted in an integrated circuit, there appears a difference or an nonuniformity between configurations of the second oscillation circuits. In consequence, the plural light projector units operate completely in an asynchronous manner. As a result, when a plurality of photoelectric switches are arranged in parallel, the mutual interference does not take place, which prevents the wrong operation associated with the interference.

In the embodiment above, by coupling the second oscillator circuit 4 with the first oscillator circuit 2, the oscillation frequency of the first oscillator 2 is swept toward the lower value. However, the oscillation frequency may be swept toward a higher value. Alternatively, the oscillation frequency may be shifted toward the higher and lower values with respect to the center frequency. In short, in accordance with the present invention, the oscillation frequency of an oscillator of the photoelectric switch is swept at a predetermined period so as to change the frequency of the light or optical signal produced from a light emitting element.

I claim:

1. A photoelectric switch having a light projector element and a first oscillation circuit for driving said light projector element by use of pulses comprising:
    a second oscillation circuit; and
    couple means for coupling said second oscillation circuit with said first oscillation circuit,
    said second oscillation circuit sweeping an oscillation frequency of said first oscillation circuit at a predetermined period to vary the oscillation frequency of said first oscillation circuit in a periodical manner.

2. A photoelectric switch in accordance with claim 1 wherein the oscillation frequency of said first oscillation circuit is higher than the oscillation frequency of said second oscillation circuit.

3. A photoelectric switch in accordance with claim 1 further comprising a circuit for producing a synchronization signal synchronized with the oscillation frequency of said first oscillation circuit.

4. A photoelectric switch comprising:
    a light projector element;
    oscillation circuit means for generating a series of pulses having a first oscillation frequency to drive said light projector element; and
    frequency modulation means for modulating said first frequency of pulses with a second oscillation frequency which is different from said first frequency such that said first frequency varies continuously and periodically over a period which is reciprocally proportional to said second frequency.

5. A photoelectric switch according to claim 4, wherein said first oscillation frequency is higher than said second oscillation frequency.

6. A photoelectric switch according to claim 4, further comprising a circuit for producing a synchronization signal which is synchronized with said first oscillation frequency of said oscillation circuit.

* * * * *